United States Patent [19]

Ban et al.

[11] Patent Number: 4,843,031

[45] Date of Patent: Jun. 27, 1989

[54] METHOD OF FABRICATING COMPOUND SEMICONDUCTOR LASER USING SELECTIVE IRRADIATION

[75] Inventors: Yuzaburo Ban, Osaka; Hiraaki Tsujii, Nara; Youichi Sasai, Hirakata; Mototsugu Ogura, Takaichi; Hiroyuki Serizawa, Hirakata, all of Japan

[73] Assignee: Matsushita Electric Industrial Co., Ltd., Osaka, Japan

[21] Appl. No.: 168,256

[22] Filed: Mar. 15, 1988

[30] Foreign Application Priority Data

| Mar. 17, 1987 | [JP] | Japan | 62-61527 |
| Mar. 18, 1987 | [JP] | Japan | 62-62905 |
| Apr. 28, 1987 | [JP] | Japan | 62-105142 |
| Nov. 2, 1987 | [JP] | Japan | 62-277604 |

[51] Int. Cl.$^4$ .................. H01L 00/00; B05D 3/06
[52] U.S. Cl. .................. 437/129; 148/DIG. 29; 148/DIG. 48; 148/DIG. 71; 148/DIG. 94; 148/33.6; 156/613; 156/649; 156/662; 357/17; 372/48; 372/50; 437/133; 437/173; 437/935; 437/936; 437/963
[58] Field of Search .............. 148/DIG. 29, 48, 65, 148/56, 71, 72, 93, 94, 110, 33.6; 156/610–615, 648, 649, 644, 643, 656, 662; 357/17, 47, 56; 372/46, 48, 103, 50; 437/133, 173, 247, 935, 936, 963, 970; 427/43.1, 42, 51, 53.1

[56] References Cited

U.S. PATENT DOCUMENTS

| 4,318,059 | 3/1982 | Lang et al. | 372/50 |
| 4,476,563 | 10/1984 | Van Ruyven | 372/50 |
| 4,577,207 | 3/1986 | Copeland | 372/50 |
| 4,607,370 | 8/1986 | Mukai et al. | 372/50 |
| 4,627,065 | 12/1986 | Logan et al. | 372/50 |

FOREIGN PATENT DOCUMENTS

| 8101529 | 6/1981 | European Pat. Off. | 437/173 |
| 0086008 | 8/1983 | European Pat. Off. | 372/50 |
| 0079791 | 5/1983 | Japan | 372/50 |

OTHER PUBLICATIONS

Lee et al., "Photoluminescence . . . Selective-Area Molecular Beam Epitaxy . . . ", Appl. Phys. Lett., 52(3), Jan. 18, 1988, pp. 215–217.
Bedair et al., Appl. Phys. Lett., 48(2), Jan. 13, 1986, pp. 174–176.

*Primary Examiner*—Brian E. Hearn
*Assistant Examiner*—William Bunch
*Attorney, Agent, or Firm*—Wenderoth, Lind & Ponack

[57] ABSTRACT

Disclosed is a method of fabricating a compound semiconductor device which is capable of forming a multi-wavelength semiconductor laser structure, double cavity type semiconductor laser structure, stripe type semiconductor laser structure transverse junction stripe type semiconductor laser structure, or semiconductor grating by a single step of epitaxial growth while illuminating a desired part of substrate surface selectively with light at the time of epitaxial growth.

11 Claims, 7 Drawing Sheets

METHOD OF FABRICATING COMPOUND SEMICONDUCTOR LASER USING SELECTIVE IRRADIATION

BACKGROUND OF THE INVENTION

This invention relates to a method of fabricating a compound semiconductor device, and more particularly to a method of fabricating a compound semiconductor device composed of a plurality of epitaxial growth layers differing in composition and conductivity type by a single growth step.

As a compound semiconductor device having a plurality of epitaxial growth layers differing in composition, for example, a semiconductor laser with multi-wavelength is known.

The semiconductor laser with multi-wavelength has plural laser emitting parts differing in wavelength contained in one element, and it is widely disclosed, for example, in U.S. Pat. Nos. 4,318,059, 4,476,563, 4,577,207, 4,607,070, 4,627,065, etc. A common defect of these semiconductor lasers with multiwavelength was that active layers of plural laser must be grown separately, which increased the number of steps of grwoth.

It was accordingly proposed to fabricate a semiconductor laser for emitting light in plural wavelengths by one growth step, and it was applied on Feb. 13, 1986 as U.S. Ser. No. 829,090. FIG. 3 of this application unveils the method of forming an MQW type semiconductor laser with multi-wavelength in a single growth step. That is, after growth of MOW layer, part of it is illuminated with light, and in this illuminated area, the composition of the thin film layer (MQW layer) is varied by thermal mechanism at the boundary of plural thin film layers which compose the MQW structure, so that the emission wavelength is different between the illuminated region and non-illuminated region of the MQW layer.

In this method, however, if applied to an ordinary semiconductor laser of double hetero junction type, it was not possible to obtain an effect equally comparable with that of the MQW layer.

SUMMARY OF THE INVENTION

It is hence a primary object of this invention to present a method of fabricating a compound semiconductor device capable of forming semiconductor laser with multi-wavelength by a single growth step, being applicable also to an ordinary semiconductor laser of double hetero junction type.

It is another object of this invention to present a method of fabricating a compound semiconductor device capable of forming not only semiconductor laser with multi-wavelength but also a plurality of epitaxial growth layers differing in composition and conductivity type in a single growth step.

These and other objects are accomplished by a method of fabricating a compound semiconductor device according to the present invention, which includes a step of epitaxially growing a first clad layer on a semiconductor substrate, an active layer on said first clad layer, a second clad layer on said active layer and a cap (contact) layer on said second clad layer while partly illuminating said semiconductor substrate, a step of electrically insulating the illuminated part and non-illuminated part of said first clad layer, active layer, second clad layer and contact layer, and a step of forming first and second electrode layers in the illuminated part and non-illuminated part of said contact layer, and a third electrode layer on the said of said semiconductor substrate where said first clad layer is not formed.

While the novel features of the invention are set forth with particularity in the appended claims, the invention, both as to organization and content, will be better understood and appreciated, along with other objects and features thereof, from the following detailed description taken in conjunction with the drawings.

DETAILED DESCRIPTION OF THE INVENTION

Fabricating steps of an AlGaAs/GaAs semiconductor laser with multi-wavelength according to this invention are shown in FIG. 1. In this case, the laser structure was initially grown epitaxially by laser-assisted MOVPE method. A growth reactor of the epitaxial growth apparatus used in this fabrication in shown in FIG. 2.

$Al(CH_3)_3$, $Ga(CH_3)_3$, $AsH_3$ were used as the source materials of Al, Ga, As, respectively, and $H_2Se$ and $Zn(CH_3)_2$ were used, as n-type and p-type dopant sources, and $H_2$ was used as carrier gas. KrF excimer laser light 10 (wavelength 249 nm) was used, as the light source for illuminating the substrate.

Figure 2:
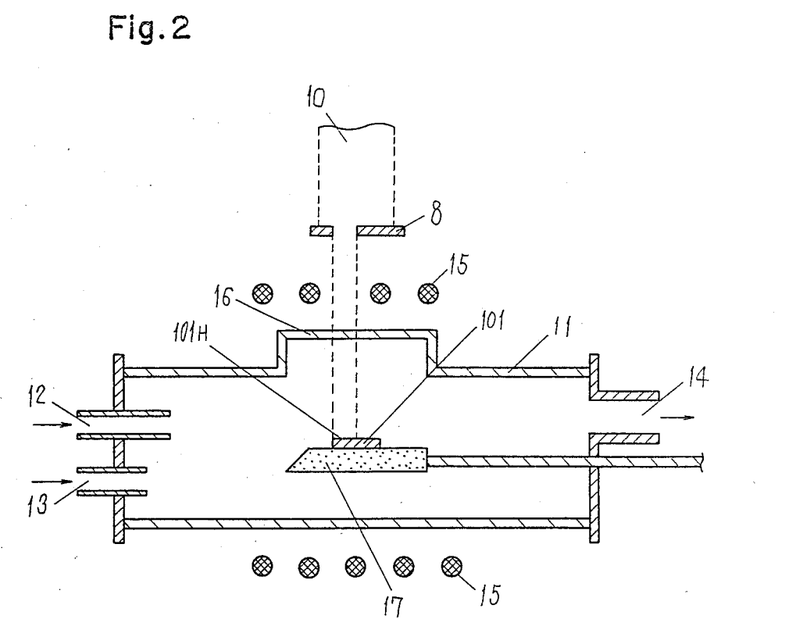
FIG. 2 is a schematic sectional view showing a growth reactor of a laser-assisted MOVPE apparatus used in embodiments of this invention.

First, the temperature of an n-type GaAs substrate 101 placed on a carbon-made susceptor 17 disposed in a growth reactor 11 was raised up to a growth temperature of 750° C. by rf induction. At this time, in order to prevent thermal damage of the GaAs substrate surface 101, $AsH_3$ was supplied at 20 cc/min. In FIG. 2, meanwhile, reference numeral 8 denotes a mask, 12 is a gas feed port of $Al(CH_3)_3$, $Ga(CH_3)_3$, $Zn(CH_3)_2$, 13 is a gas feed port of $AsH_3$, $H_2Se$, $Si(CH_3)_4$, 14 is gas exhaust port, 15 is a rf coil, and 16 is a light incidence window.

|  | $Al(CH_3)_3$ (sccm) | $Ga(CH_3)_3$ (sccm) | $AsH_3$ (sccm) | $H_2Se$ (sccm) | $Zn(CH_3)_2$ (sccm) |
| --- | --- | --- | --- | --- | --- |
| (1) AlGaAs; Se growth | 0.12 | 0.28 | 20 | 0.02 | — |
| (2) AlGaAs growth | 0.02 | 0.38 | 20 | — | — |
| (3) AlGaAs; Zn growth | 0.12 | 0.28 | 20 | — | 0.016 |

-continued

| | Al(CH$_3$)$_3$ (sccm) | Ga(CH$_3$)$_3$ (sccm) | AsH$_3$ (sccm) | H$_2$Se (sccm) | Zn(CH$_3$)$_2$ (sccm) |
|---|---|---|---|---|---|
| (4) GaAs; Zn growth | — | 0.4 | 20 | — | 0.016 |

The total flow rate in this process was 5 l/min, and the reactor pressure during growth was 100 Torr.

Figure 1A:
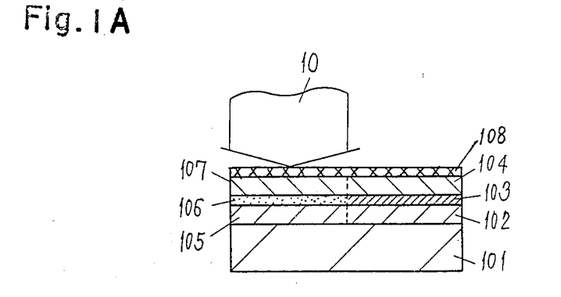
FIGS. 1A to 1C, FIGS. 4A to 4C, and FIGS. 5A to 5C are schematic sectional views showing fabricating steps of a semiconductor laser with multi-wavelength, Zn diffused stripe type semiconductor laser, and transverse junction stripe type semiconductor laser, respectively, in embodiments of this invention.

Referring back to FIG. 1 to explain the fabricating steps, n-type Al$_{0.3}$Ga$_{0.7}$As layer 102, n-type Al$_{0.05}$Ga$_{0.95}$As layer 103, p-type Al$_{0.3}$Ga$_{0.7}$As layer 104 and p-type GaAs layer 108 were sequentially grown epitaxially on the n-type GaAs substrate 101. During this growth period, a half portion 101H of the substrate 101 (see FIG. 2) was irradiated with KrF excimer laser light 10, with a power of 1.5 W/cm$^2$, from the direction vertical to the substrate surface.

As a result, in the laser light non-illuminated part on the n-type GaAs substrate 101, Al$_{0.3}$Ga$_{0.7}$As: Se 102, Al$_{0.05}$Ga$_{0.95}$As 103, and Al$_{0.3}$Ga$_{0.7}$As: Zn 104 were sequentially formed by epitaxial growth, whereas in the laser light illuminated part, the Al$_{0.4}$Ga$_{0.6}$As: Se 105, Al$_{0.15}$Ga$_{0.85}$As 106, and Al$_{0.4}$Ga$_{0.6}$As: Zn 107 layers with the Al composition greater by 0.1 respectively than that in the non-illuminated part were sequentially grown.

Figure 1B:
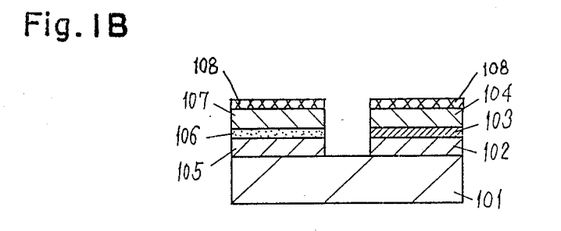

Next, as shown in FIG. 1B, the interface of the laser light illuminated part and non-illuminated part was selectively etched by using a photoresist (not shown) as a mask, and the illuminated part and nonilluminated part were electrically isolated.

Figure 1C:
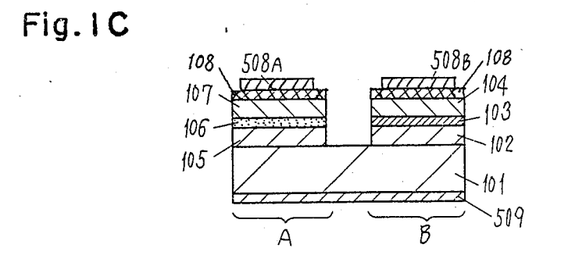

Finally, as shown in FIG. 1C, two p-type electrodes 508A, 508B were formed on the GaAs:Zn layer 108 of the illuminated part and the non-illuminated part by using Au/Zn, and an n-type electrode 509 was formed on the back side of the n-type GaAs substrate 101 by using Au/Ge/Ni.

In this embodiment, therefore, it is possible to fabricate an array structure of semiconductor laser with different composition of active layers 103, 106 by a single step of epitaxial growth. In this case, the wavelength of semiconductor laser was 801 nm in the illuminated part (A in FIG. 1C), and 834 nm in the non-illuminated part (B in FIG. 1C). The emission positions of these laser lights of two different wavelengths were at equal distances from the substrate and were mutually close to each other, so that they could be easily used as the light source in the optical communications and optical disk related fields.

Incidentally, the composition of epitaxial film grown by this light-assisted epitaxy can be varied by the growth temperature, gas flow rate, type of excitation light and power and wavelength of excitation light. It is hence possible to form a layer with three or more different compositions on a same substrate simultaneously by irradiating with plural light beams or scanning beams of excitation light. This embodiment related to a semiconductor laser with two wavelengths, but it is evident that the invention may be applied in semiconductor lasers with three or more wavelengths. Besides, this embodiment was an example of laser in a stripe electrode structure, but it can be, needless to say, applied also in lasers in various structures such as buried-hetero structure. Anyway the semiconductor laser with multi-wavelength of this invention is fabricated by forming active layers differing in composition simultaneously by irradiating part of the substrate with light during epitaxial growth of its laser structure. That is, in a single step of epitaxial growth, active layers differing in composition are formed simultaneously. Therefore, the distance of each active layer from the substrate and the thickness of each active layer are exactly the same, and it is also possible to bring the active layers sufficiently closer to each other. Furthermore, since all active layers can be formed by a single epitaxial growth step, an epitaxial layer of an extremely excellent crystallinity will be obtained.

As a result, when this multi-wavelength semiconductor laser is used in optical communications and optical disk related fields, the optical system to be installed outside the semiconductor laser will be simplified because the emission positions of laser lights are arranged closely to each other in a line, and its value of use and practical effect are great.

Figure 3A:
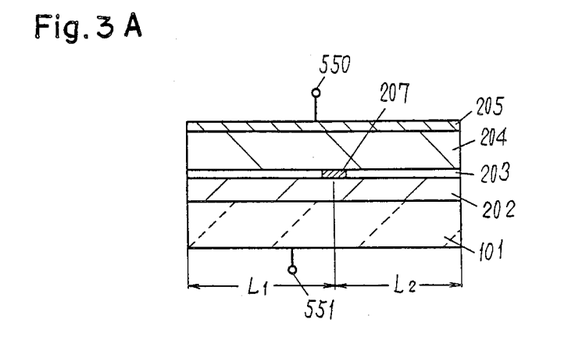
FIGS. 3A, 3B are schematic structural sectional views of semiconductor lasers with double cavity (IRI type and IPC type) in other embodiments of this invention.

Referring now to FIG. 3, a fabricating method of semiconductor lasers with double cavity in a second embodiment of this invention is explained below. FIG. 3A is a structural drawing of an IRI type semiconductor laser as one of the semiconductor laser with double cavity. As an epitaxial layer structure, Al$_x$Ga$_{1-x}$As n-type clad layer 202, Al$_x$Ga$_{1-x}$As active layer 203, Al$_x$Ga$_{1-x}$As p-type clad layer 204, and GaAs p-type contact layer 205 are sequentially grown on a GaAs substrate 101. In this Al$_x$Ga$_{1-x}$As active layer 203, Al$_y$Ga$_{1-y}$As semiconductor layer 207 with Al composition y greater than composition x, is provided. Namely band gap energy of Al$_y$Ga$_{1-y}$As layer is greater than that of Al$_x$Ga$_{1-x}$As layer. Therefore, a region with larger effective refractive index than the other part is formed in the middle in the cavity of semiconductor laser following that double cavity L$_1$, L$_2$ are formed. This is because the effective refractive index is increased in the vicinity of the layer 207, and the laser light propagating in the laser active layer is internally reflected near the layer 207. Numerals 550, 551 are electrodes.

Figure 3B:
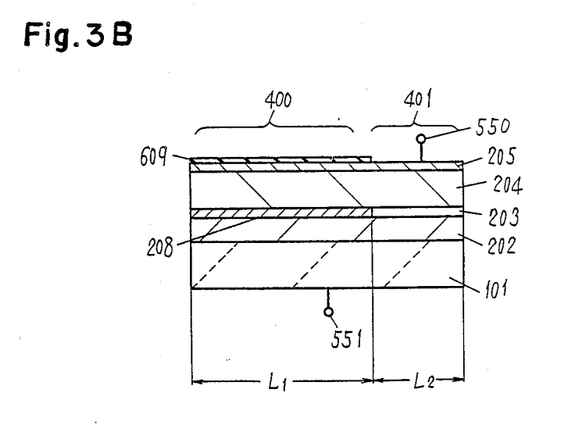

FIG. 3B shows a structural sectional view of the other example of IPC (Integlated Passive Cavity) type semiconductor laser. This example is similar to the structure in FIG. 3A, except that a region 208 with a larger band gap energy is disposed at the passive region 400 side in the cavity direction within the active layer 203. In this embodiment, in order to enhance the efficiency of current injection into an active region 401, an insulating film is formed on the contact layer surface in the passive region. Therefore the region 208 corresponds to the waveguide layer, which is resulting that, two cavities L$_1$, L$_2$ are formed as double cavity.

In fabrication of the semiconductor laser structure in the embodiment shown in FIGS. 3A, 3B, the same epitaxial growth apparatus as shown in FIG. 2 was used.

Fabrication of active layer on the substrate 101 by using this apparatus is explained below. For the ease of explanation, the substrate is a GaAs single crystal wafer and the active layer is Al$_x$Ga$_{1-x}$As layer. namely the Al concentration is higher in the AlGaAs layer in the illuminated parts, resulting that an expitaxial layer with a larger band gap energy is grown on a same plane. Next, a p-type AlGaAs clad layer 204 was grown, supplying Ga(CH$_3$)$_3$, Al(CH$_3$)$_3$, AsH$_3$, Zn(CH$_3$)$_2$ gases and stopping the excimer laser light irradiation, and finally a p-type GaAs contact layer 205 was grown. In FIGS. 3A, 3B, meanwhile, numeral 550 denotes an electrode.

Thus, according to this invention, since the laser structure become simpler than the conventional one, it can be fabricated easily. For example, in the conventional IRI type laser. Because the photoresist or the like may be left over the substrate surface after forming a "hill" on the substrate, the epitaxial growth become difficult. However according to this invention, since the substrate processing step is not needed, the epitaxial yield is enhanced. On the other hand, in the conventional IPC type laser, waveguide layer and separation layer are necessary in order to form a passive region, and also a mesa structure is needed for separation of active region from passive region. However in this invention, waveguide layer and separation layer are not required, and the crystal surface has a planar structure. As a result enhancement of process and epitaxial yield is expected.

The semiconductor laser according to this invention may be, as clear from the description above, easily realized by making use of the light-assisted vapor phase growth technology and the practical effect is great. Needless to say, the characteristics of the semiconductor laser of this invention is equally comparable with that of the conventional semiconductor laser. In this case, $Al(CH_3)_3$, $Ga(CH_3)_3$ and $AsH_3$ were used as the source gas of Al, Ga and As, respectively, and $H_2$ was used as carrier gas. $H_2Se$ and $Zn(CH_3)_2$ were used as n-type and p-type dopant source gases respectively. As the laser light, 193 nm light from an ArF excimer laser was used. In the fabrication process, first, a GaAs substrate 101 was placed on a carbon-made susceptor 17 in a growth reactor 11. While supplying $AsH_3$, the substrate 101 was heated up to a growth temperature, and after reaching the growth temperature, $AsH_3$, $Al(CH_3)_3$, $Ga(CH_3)_3$ and $H_2Se$ were introduced into the growth reactor 11 to grow an n-type $Al_xGa_{1-x}As$ clad layer 202. Next, an active layer 203 was grown, supplying $Ga(CH_3)_3$, $Al(CH_3)_3$, $AsH_3$, while a desired part (207 in FIG. 3A, 208 in FIG. 3B) of the surface of clad layer 202 was irradiated with excimer laser light by way of a mask 8. The individual conditions are as shown in the table below.

| (Growth conditions of active layer) | |
| --- | --- |
| Substrate | GaAs |
| Growth temperature | 700° C. |
| Reactor pressure | 100 Torr |
| Ga(CH₃)₃ feed | 0.28 sccm |
| Al(CH₃)₃ feed | 0.12 sccm |
| AsH₃ feed | 100 sccm |
| Total H₂ flow | 5 slm |
| Laser wavelength | 193 nm |
| Laser power | 1.5 W/cm² |

When epitaxial growth is performed in the above condition, an $Al_\alpha Ga_{1-\alpha}As$ layer 207 (208) and an $Al_\beta Ga_{1-\beta}As$ layer 203 are selectively formed in the laser illuminated part, and non-illuminated part, respectively, as shown in FIG. 3A (3B). Here, $\alpha \gg \beta$, Turning next to FIG. 4, a manufacturing process of AlGaAs/GaAs Zn-diffused stripe type semiconductor laser according to this invention is described below. In this case, the laser structure was epitaxially grown by the laser-assisted MOVPE method as shown in FIG. 2.

$Al(CH_3)_3$, $Ga(CH_3)_3$, $AsH_3$ were used as the source materials of Al, Ga, As, respectively, and $Si(CH_3)_4$ and $Zn(CH_3)_2$ were used, as n-type and p-type dopant sources, and $H_2$ was used as carrier gas.

Figure 4A:
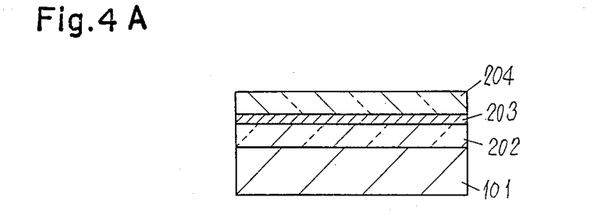
Figure 4B:
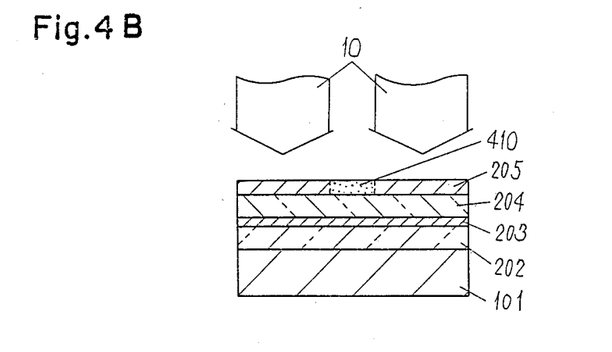
Figure 4C:
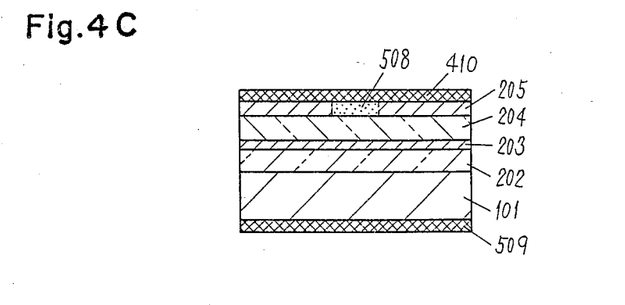

In the first step, an n-type GaAs substrate 101 mounted on carbon-made susceptor in the growth reactor 11 was heated inductively up to growth temperature of 750° C. At this time, $AsH_3$ was supplied at 20 cc/min in order to prevent thermal damage of the surface of GaAs substrate 101. Then, as shown in FIG. 4, n-type AlGaAs clad layer 202, GaAs active layer 203, p-type A GaAs clad layer 204, and n-type GaAs layer 205 were sequentially grown in the following growth conditions to compose a semiconductor laser structure.

| | Al(CH₃)₃ (sccm) | Ga(CH₃)₃ (sccm) | AsH₃ (sccm) | Si(CH₃)₄ (sccm) | Zn(CH₃)₂ (sccm) |
| --- | --- | --- | --- | --- | --- |
| (1) n-type AlGaAs; Si growth | 0.12 | 0.28 | 20 | 0.016 | — |
| (2) GaAs growth | — | 0.4 | 20 | — | — |
| (3) p-type AlGaAs; Zn growth | 0.12 | 0.28 | 20 | — | 8 × 10⁻³ |
| (4) n-type GaAs growth | — | 0.4 | 20 | 0.012 | 6.25 × 10⁻³ |

In this case, the total flow rate was 5 l/min, and the reactor pressure during growth was 100 Torr. As stated above, moreover, in the case of growth of n-type GaAs layer 205, n-type dopant source $Si(CH_3)_4$ and p-type dopant source $Zn(CH_3)_2$ were supplied simultaneously, and, as shown in FIG. 4B, simultaneously with these supplies, the substrate surface was irradiated with an ArF excimer laser light 100 of stripe pattern (in this case, the stripe part is the non-illuminated part, with pattern width of 10 μm) from the vertical direction with a power of 1.5 W/cm².

As a result, a p-type region 508 with carrier concentration of $5 \times 10^{17}$ cm⁻³ and an n-type region with carrier concentration of $5 \times 10^{17}$ cm⁻³ were formed in the non-illuminated part and in the illuminated part of the GaAs cap layer 205, respectively, following that a same structure as Zn diffusion stripe was obtained.

Finally, a p-type electrode 508 was formed on the GaAs cap layer 205 by using Au/Zn, and an n-type electrode 509 on the back side of the n-type GaAs substrate 101 by using Au/Ge/Ni.

In such embodiment, a Zn-diffused stripe type semiconductor laser structure can be formed by a single step of epitaxial growth, and the step for Zn diffusion process can be omitted. As a result the fabrication process has been greatly simplified. Meanwhile diffusion of Zn into the GaAs active layer 203 which might induce deterioration of the laser characteristics was not caused.

Figure 5:
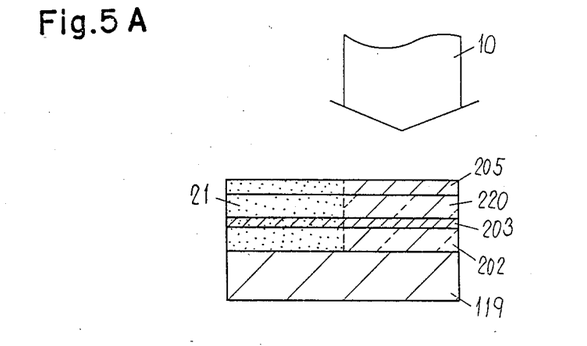

Referring now to FIG. 5, a fabricating process of an AlGaAs/GaAs transverse junction stripe type semiconductor laser according to this invention is described below. In FIG. 5, the same parts as in FIG. 4 are identified with the same reference numbers.

On this case, the growth method, source materials, dopant sources and carrier gas used in the epitaxial growth of the laser structure, and the substrate cleaning method before growth, total flow rate, and reactor pressure were exactly the same as in the case of Zn diffused stripe type semiconductor laser. First, AlGaAs clad layer 202, GaAs active layer 203, AlGaAs clad layer 220, and GaAs contact layer 205 were sequentially grown on a semi-insulating GaAs substrate 119, in the following growth conditions.

|     |               | Al(CH₃)₃ (sccm) | Ga(CH₃)₃ (sccm) | AsH₃ (sccm) | Si(CH₃)₄ (sccm) | Zn(CH₃)₂ (sccm) |
|-----|---------------|-----------------|-----------------|-------------|-----------------|------------------|
| (1) | AlGaAs growth | 0.12            | 0.28            | 20          | 0.012           | $6.25 \times 10^{-3}$ |
| (2) | GaAs growth   | —               | 0.4             | 20          | 0.012           | $6.25 \times 10^{-3}$ |
| (3) | AlGaAs growth | 0.12            | 0.28            | 20          | 0.012           | $6.25 \times 10^{-3}$ |
| (4) | GaAs growth   | —               | 0.4             | 20          | 0.012           | $6.25 \times 10^{-3}$ |

In this case, as described above, a half portion of the substrate surface was irradiated with ArF excimer laser with a power of 1.5 W/cm² from the vertical direction and p- and n-type dopant sources were simultaneously supplied during the epitaxial growth period.

As a result, as shown in FIG. 5A, p-type layers with carrier concentration of $5 \times 10^{17}$ cm$^{-3}$, were formed in the non-illuminated parts of all epitaxial layers, while an n-type layers with carrier concentration of $5 \times 10^{17}$ cm$^{-3}$ were formed in the illuminated part.

Next, as shown in FIG. 5B, the interface of the laser illuminated part and non-illuminated part of the GaAs cap layer 205 was selectively etched by using the photoresist as a mask, in order to electrically insulate the laser illuminated part and non-illuminated part of the GaAs cap layer 205.

Finally, as shown in FIG. 5C, n-type electrode and p-type electrode were formed on the illuminated part and non-illuminated part of the GaAs cap layer, by using Au/Ge/Ni and Au/Zn, respectively.

In this embodiment, too, a transverse junction stripe type semiconductor laser structure could be formed by a single step of epitaxial growth, and the manufacturing process was simplified.

This embodiment related to the stripe diffusion type and transverse junction stripe type semiconductor lasers, but it can be also applied, as a matter of course, in other laser structure such as buried-hetero structure.

The semiconductor laser according to this invention is formed in a single step of epitaxial growth, by simultaneously supplying an n-(p-)type dopant source with larger photodecomposition efficiency than thermal decomposition efficiency and a p-(n-) type dopant source with scarce light irradiation effect, and irradiating a desired portion of a desired epitaxial layer with light. Therefore, in a single epitaxial growth step, the same laser structure as in the structure after formation of Zn diffused region in the prior art can be formed, and the process can be notably simplified. At the same time, since the position of the conventional diffusion region can be controlled by the position and time of light irradiation, its positional precision, in particular, the precision of the conventional diffusion front position can be enhanced.

A method of fabricating a semiconductor grating by this invention is realized in the following embodiment.

Figure 6:
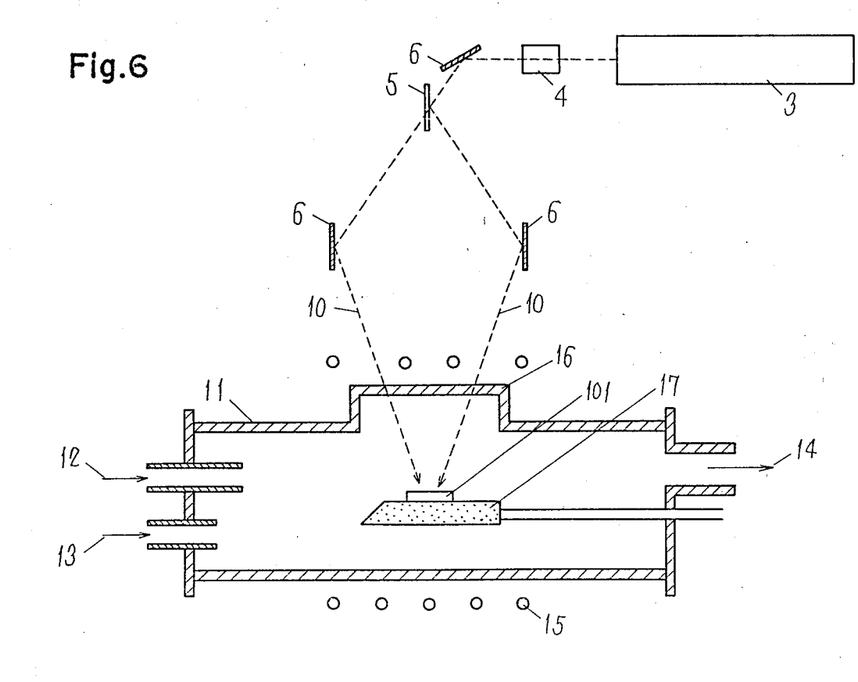
FIG. 6 is a schematic sectional view to explain a method of fabricating a semiconductor grating in a further different embodiment of this invention.
Figure 7:
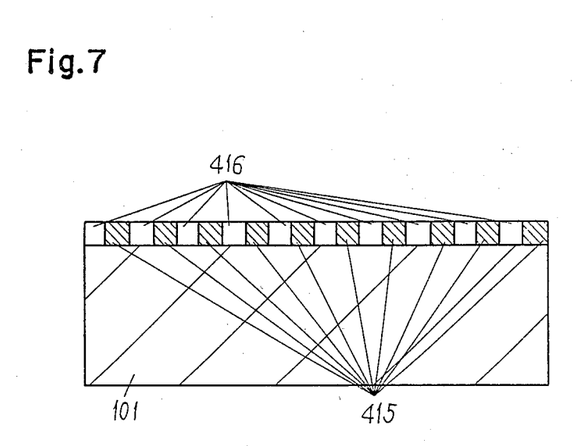
FIG. 7 is a structural sectional view of a semiconductor grating manufactured according to a fabricating method of this invention.

FIG. 6 shows an apparatus used in fabrication of a semiconductor grating, that is, a schematic diagram of introduction of interference laser light into a growth reactor of MOVPE growth system. In this case, the growth reactor is identical as the one used in the foregoing embodiments, but the optical system for illumination of the substrate is designed to form interference laser light. The method of forming a grating on the GaAs substrate as shown in FIG. 7 by using this apparatus is described below.

In this case, Ga(CH₃)₃, Al(CH₃)₃, AsH₃ were used as the source gases of Ga, Al, As, respectively, and Si(CH₃)₄ and Zn(CH₃)₂ were used as n- and p-type dopant sources, and H₂ was used as carrier gas. ArF excimer laser light (wavelength 193 nm) was used as the laser light source.

It is generally considered that the grating is composed by a periodic variation of composition, carrier concentration or conduction type. The fabrication conditions for individual cases are summarized in the table below.

|                      | Composition | Carrier concentration | Conduction type |
|----------------------|-------------|-----------------------|------------------|
| Substrate            | GaAs        |                       |                  |
| Growth temperature   | 700° C.     | 700° C.               | 700° C.          |
| Growth pressure      | 100 Torr    | 100 Torr              | 100 Torr         |
| Ga(CH₃)₃ feed        | 0.28 sccm   | 0.4 sccm              | 0.4 sccm         |
| Al(CH₃)₃ feed        | 0.12 sccm   | —                     | —                |
| AsH₃ feed            | 100 sccm    | 20 sccm               | 20 sccm          |
| Zn(CH₃)₂ feed        | —           | —                     | $6.25 \times 10^{-3}$ sccm |
| Si(CH₃)₄ feed        | —           | 0.012 sccm            | 0.012 sccm       |
| Total H₂ flow        | 5 slm       | 5 slm                 | 5 slm            |
| Laser wavelength     | 193 nm      | 193 nm                | 193 nm           |
| Laser power          | 1.5 W/cm²   | 1.5 W/cm²             | 1.5 W/cm²        |

In the fabrication process, first, the GaAs substrate 101 was placed on a carbon-made susceptor 17 in a growth reactor 11. While supplying AsH₃, the substrate was heated inductively up to a growth temperature. Next, Ga(CH₃)₃ and Al(CH₃)₃ were introduced when forming periodic change of composition, Ga(CH₃)₃ and n-type dopant source Si(CH₃)₄ were supplied when forming periodic changes of carrier concentration periodically, or Ga(CH₃)₃, Si(CH₃)₄ and p-type dopant source Zn(CH₃)₂ were supplied when forming periodic change of conduction type, while, at the same time, the substrate 101 was irradiated with ArF excimer interference laser light (wavelength 193 nm). As a result an A GaAs layer was formed in the laser illuminated part and a GaAs layer in the non-illuminated part in the case of periodic changes of composition a GaAs layer with carrier concentration of $10^{18}$ cm$^{-3}$, in the illuminated part and a GaAs layer with carrier concentration of $10^{17}$ cm$^{-3}$ in the non-illuminated area in the case of periodic change of carrier concentration, and an n-type GaAs layer in the illuminated part and a p-type GaAs layer in the non-illuminated part in the case of periodic change conduction type. This fabrication depends on the phenomena that the decomposition rate of Al(CH₃)₃ and Si(CH₃)₄ is increased by ArF excimer laser irradiation, and that the Ga(CH₃)₃ and the Zn(CH₃)₂ is hardly affected by laser irradiation at growth temperature of 700° C.

Thus fabricated semiconductor grating is steeply changed in the composition, carrier concentration or conduction type at the interface between the laser illuminated part and non-illuminated part, and asperities are improved about 50% as compared with the conventional grating formed using chemical etching method, and a high diffraction efficiency is obtained.

The method of fabricating a semiconductor grating according to this invention is a method of only irradiating the substrate surface with interference laser light during an ordinary epitaxial growth. The diffraction efficiency of this semiconductor grating is high, and since the surface is not exposed to air in the fabrication step of grating and the resist is not left over on the grating as experienced in the prior art, epitaxial growth on the grating can be effected without any problem. Furthermore, the position and size of fabricating the grating on the substrate can be determined by the irradiation position and the size of the interference laser light on the substrate, and it is very useful in fabrication of opt integlated ICs and the like. The fabricating method by this invention is very high in the practical effect.

This embodiment related to the AlGaAs/GaAs semiconductor laser and grating. This invention, however can be used not only in InGaAsP/InP compound, AlGaInP/GaAs compound and other III-V group compound semiconductors, but also in ZnSe or ZnSSe or other II-VI group compound semiconductors, and chalcopyrite type compound semiconductors such as $CuGaSe_2$ and $CuAlS_2$. As the combination of n-type and p-type dopant sources, in this embodiment, $Si(CH_3)_4$ and $Zn(CH_3)_2$ were used, but this invention can be used not only in the combination of other n-type dopant source with larger photodecomposition rate than the thermal decomposition efficiency and p-type dopant source which has scarce light irradiation effect, but also in the combination of n-type dopant source which has scarce light irradiation effect and p-type dopant source with larger photodecomposition rate than thermal decomposition efficiency.

Furthermore, in the presented embodiment, metal organic vapor phase epitaxy method was employed as the epitaxial growth technology, but it is possible to employ not only the compound semiconductor epitaxial growth method such as hydride vapor phase epitaxy and chloride vapor phase epitaxy, but also the molecular beam epitaxy (MBE) and metal organic molecular beam epitaxy (MOMBE). Still more, in the described embodiments, ArF and KrF excimer lasers were used as the laser light, but this invention may be also realized by using other excimer lasers or other gases, or $CO_2$ laser, He-Cd laser, Ar laser, YAG layer, He-Ne laser, etc.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. A method of fabricating a compound semiconductor device comprising:
    a step of epitaxially growing a first clad layer on a semiconductor substrate, an active layer on said first clad layer, a second clad layer on said active layer and a contact layer on said second clad layer while partially illuminating said semiconductor substrate with light;
    a step of electrically insulating between the illuminated part and non-illuminated part of said first clad layer, active layer, second clad layer and contact layer; and
    a step of forming first and second electrode layers in the illuminated part and non-illuminated part of said contact layer, and a third electrode layer on the side of said semiconductor substrate where said first clad layer is not formed.

2. A method of claim 1, wherein said semiconductor substrate and first clad layer are of a first conductive type, and second clad layer and contact layer is of a second conductive type which is different from said first conductive type.

3. A method of claim 1, wherein electric insualtion is achieved by etching and removing the contact layer, the first and second clad layer and active layer located in the boundary area of the illuminated part and non-illuminated part.

4. A method of claim 1, wherein said light is laser light.

5. A method of fabricating a semiconductor laser comprising:
    a step of forming a first clad layer on a semiconductor substrate;
    a step of epitaxially growing an active layer on said first clad layer while illuminating part of the first clad layer with light;
    a step of epitaxially growing a second clad layer on said active layer; and
    a step of forming a first electrode on said second clad layer and a second electrode on the side of the semiconductor substrate where said first clad layer is not formed.

6. A method of claim 5, wherein the band gap energy of the illuminated part of the active layer is greater than that of the non-illuminated part.

7. A method of fabricating a semiconductor laser comprising:
    a step of sequentially growing epitaxially a first clad layer on a semiconductor substrate, an active layer on said first clad layer, and a second clad layer on said active layer;
    a step of growing epitaxially a semiconductor layer while illuminating a desired part with light while supplying n-type and p-type dopant sources simultaneosuly on said second clad layer; and
    a step of forming a first electrode layer on said semiconductor layer, and a second electrode layer on the side of said semiconductor substrate where said first clad layer is not formed.

8. A method of claim 7, wherein at least one of the n-type and p-type dopant sources supplied simultaneosuly is a material of which photodecomposition rate is greater than the thermal decomposition efficiency at the epitaxial growth temperature.

9. A method of fabricating a semiconductor laser comprising:
    a step of growing epitaxially a first clad layer, an active layer, a second clad layer and a cap layer sequentially on a semi-insulating semiconductor substrate, while simultaneously supplying n-type and p-type dopant sources and illuminating part of said semiconductor substrate with light; and
    a step of forming a first electrode layer and a second electrode layer on the illuminated part and non-illuminated part on said cap layer.

10. A method of claim 9, wherein at least one of the n-type and p-type dopant sources supplied simultaneously is a material of which photodecomposition rate is greater than the thermal decomposition efficiency at the epitaxial growth temperature.

11. A method of fabricating a semiconductor grating by epitaxially growing a semiconductor layer on a substrate while illuminating the substrate surface with interference laser light.

* * * * *